United States Patent [19]

Nath et al.

[11] Patent Number: 4,598,306

[45] Date of Patent: Jul. 1, 1986

[54] BARRIER LAYER FOR PHOTOVOLTAIC DEVICES

[75] Inventors: Prem Nath, Rochester; Masatsugu Izu, Birmingham, both of Mich.

[73] Assignee: Energy Conversion Devices, Inc., Troy, Mich.

[21] Appl. No.: 518,184

[22] Filed: Jul. 28, 1983

[51] Int. Cl.$^4$ ............................................. H01L 27/14
[52] U.S. Cl. ........................................ 357/30; 357/2; 357/90; 357/58; 357/61; 357/16; 357/49; 357/54
[58] Field of Search ............... 357/30, 30 B, 30 F, 357/30 J, 30 K, 2, 90, 58, 61, 16, 49, 54

[56] References Cited

U.S. PATENT DOCUMENTS

| | | | |
|---|---|---|---|
| 2,870,342 | 1/1959 | Walker et al. | 357/30 X |
| 4,069,492 | 1/1978 | Pankove et al. | 357/2 X |
| 4,117,506 | 9/1978 | Carlson et al. | 357/30 |
| 4,119,840 | 10/1978 | Nelson | 357/30 X |
| 4,320,249 | 3/1982 | Yamazaki | 357/30 X |
| 4,387,387 | 6/1983 | Yamazaki | 357/30 |
| 4,438,446 | 3/1984 | Tsang | 357/90 X |

FOREIGN PATENT DOCUMENTS

| | | | |
|---|---|---|---|
| 0037512 | 12/1975 | Japan | 357/30 F |
| 2083703 | 3/1982 | United Kingdom | 357/30 K |

*Primary Examiner*—Andrew J. James
*Assistant Examiner*—William A. Mintel
*Attorney, Agent, or Firm*—Marvin S. Siskind; Ronald W. Citkowski

[57] ABSTRACT

An improved semiconductor device, adapted to provide electrical current in response to light energy incident thereon, includes a first electrode, an active semiconductor body atop the first electrode, a second electrode atop the semiconductor body, and at least one defect region which is capable of providing a low resistance shunt path for the flow of electrical current between the electrodes of the device. The improvement comprises a continuous transparent barrier layer (1) operatively disposed between the semiconductor body and one of the electrodes of the device and (2) adapted to decrease the flow of electrical current through the at least one defect region of the semiconductor device. The barrier layer is formed from a material chosen from the group consisting essentially of oxides, nitride and carbides of: indium, tin, cadmium, zinc, antimony, silicon, chromium and mixtures thereof. Methods of (1) fabricating improved semiconductor devices and (2) preventing operational mode failures due to latent detents are also disclosed.

20 Claims, 5 Drawing Figures

BARRIER LAYER FOR PHOTOVOLTAIC DEVICES

FIELD OF THE INVENTION

This invention relates generally to semiconductor devices, and more particularly, to (1) improved thin film photovoltaic devices, each device incorporating a barrier layer which is adapted to substantially decrease the flow of electrical current through current-shunting defect regions; and (2) methods of fabricating improved photovoltaic devices which incorporate said barrier layer.

BACKGROUND OF THE INVENTION

The improved photovoltaic devices disclosed herein (1) exhibit increased operational reliability, (2) exhibit increased operational efficiency, and (3) are fabricated in a manner which results in increased yields. Also disclosed are methods for the fabrication of said improved photovoltaic devices. The present invention has particular applicability to (1) large area, thin film, amorphous photovoltaic devices wherein the active semiconductor elements thereof are deposited onto a substrate electrode as relatively thin layers which are subsequently covered by a second electrode, and (2) the fabrication of such thin film, large area photovoltaic devices from amorphous semiconductor alloys.

Single crystal photovoltaic devices, especially crystalline silicon photovoltaic devices have been utilized for some time as sources of electrical power because they are inherently non-polluting, silent and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their amorphous counterparts; and (3) are expensive and time consuming to fabricate.

Recently, considerable efforts have been made to develop systems for depositing amorphous semiconductor materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous", as used herein, includes all materials or alloys which have long range disorder, although they may have short or intermediate range order or even contain, at times, crystalline inclusions.

It is now possible to prepare amorphous silicon alloys by glow discharge deposition or vacuum deposition techniques, said alloys possessing (1) acceptable concentrations of localized states in the energy gaps thereof, and (2) high quality electronic properties. Such techniques are fully described in U.S. Pat. No. 4,226,898, entitled Amorphous Semiconductors Equivalent To Crystalline Semiconductors, issued to Stanford R. Ovshinsky and Arun Madan on Oct. 7, 1980; U.S. Pat. No. 4,217,374, of Stanford R. Ovshinsky and Masatsugu Izu, which issued on Aug. 12, 1980, also entitled Amorphous Semiconductors Equivalent To Crystalline Semiconductors; and U.S. Pat. No. 4,517,223 of Stanford R. Ovshinsky, David D. Allred, Lee Walter, and Stephen J. Hudgens entitled Method Of Making Amorphous Semiconductor Alloys And Devices Using Microwave Energy. As disclosed in these patents, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498 issued Aug. 16, 1960. The multiple cell structures therein discussed utilized p-n junction crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. The multiple cells preferably include a back reflector for increasing the percentage of incident light reflected from the substrate back through the semiconductor layers of the cells. It should be obvious that the use of a back reflector increases the operational efficiency of the multiple cells. Accordingly, it is important that any layer deposited atop the substrate be transparent to pass a high percentage of incident light from the reflective surface of the back reflector through the semiconductor layers.

Unlike crystalline silicon which is limited to batch processing for the manufacture of solar cells, amorphous silicon alloys can be deposited in multiple layers over large area substrates to form solar cells in a high volume, continuous processing system. Such continuous processing systems are disclosed in the following U.S. Patents: No. 4,400,409 entitled for A Method Of Making P-Doped Silicon Films And Devices Made Therefrom; No. 4,542,711 entitled for Continuous Systems For Depositing Amorphous Semiconductor Material; No. 4,410,558, entitled for Continuous Amorphous Solar Cell Production System; No. 4,438,723 entitled for Multiple Chamber Deposition And Isolation System And Method; No. 4,492,181 entitled for Method And Apparatus For Continuously Producing Tandem Amorphous Photovoltaic Cells; and No. 4,485,125 entitled for Method and Apparatus For Continuously Producing Tandem Amorphous Photovoltaic Cells. As disclosed in these applications, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. Since each deposited semiconductor alloy, and especially the intrinsic semiconductor alloy, must be of high purity; (1) the deposition environment in the intrinsic deposition chamber is isolated, by specially designed gas gates, from the doping constituents within the other chambers to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4) the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

As is obvious from the foregoing, thin film amorphous semiconductor materials offer several distinct advantages over crystalline materials, insofar as they can be easily and economically fabricated by the newly developed mass production processes. However, in the fabrication of semiconductor material by the aforementioned processes, the presence of current-shunting defects has been noted. These defects have (1) seriously impaired the performance of the photovoltaic devices fabricated therefrom and (2) detrimentally affected production yield. These process-related defects are thought to either (1) be present in the morphology of the substrate electrode, or (2) develop during the deposition of the semiconductor layers. It is to the end of eliminating, or at least substantially reducing the effects of these current-shunting defects to which the instant invention is directed.

The most important of said defects may be characterized as "shunt", or "short-circuit" defects or defect regions. Before the suspected causes of these defects are explained, it is helpful to note the thicknesses of the deposited semiconductor layers. A typical p layer may be only on the order of 400 angstroms thick, a typical i layer may be only be on the order of 3500 angstroms thick, and a typical n layer may be only on the order of 200 angstroms thick, thereby providing a total semiconductor body thickness of only about 4100 angstroms. It should therefore be appreciated that irregularities, however small, are not easy to cover by the deposited semiconductor layers.

Shunt defects are present when one or more low resistance current paths develop between the electrodes of the photovoltaic device. Under operating conditions, a photovoltaic device in which a shunt defect has developed, exhibits either (1) a low power output, since electrical current collected at the electrodes thereof flows through the defect region (the path of least resistance) in preference to an external load, or (2) complete failure where sufficient current in shunted through the defect region to "burn out" the device.

While shunt-type defects always deleteriously effect the performance of photovoltaic devices, their effect is greatest when the devices in which they are incorporated are operated under relatively low illumination, such as room light, vis-a-vis, high intensity illumination such as AM 1. This occurs because, in a photovoltaic device, photo-generated current increases linearly with increasing illumination, while the resulting voltage increases exponentially with increasing illumination. In other words, voltage attains a relatively high value under low illumination, the value increasing only slightly as the intensity of the illumination is increased. The result is that under low illumination a relatively high voltage potential is present, said potential adapted to preferentially drive the relatively small number of current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for the paths of least resistance (through the defect regions). The result is that a proportionally smaller number of current carriers are able to pass through the limited number of available low resistance paths, thereby forcing the remainder of the current carriers to pass through the semiconductor material. Therefore, the loss of power resulting from the current-shunting effects of the defect regions will not be proportionally as great under high illumination as under low illumination.

Defects or defect regions, the terms being interchangeably used herein, are not limited to "overt" or "patent" short circuit current paths. In some cases the adverse effects of a defect are latent and do not immediately manifest themselves. Latent defects can give rise to what will be referred to hereinafter as an "operational mode failure", wherein a photovoltaic device, initially exhibiting satisfactory electrical performance, suddenly fails. The failures will be referred to in this application as operational mode failures regardless of whether the device was previously connected to a load for the generation of power, it only being necessary that the device was, at some time, subjected to illumination, thereby initiating the generation of carriers. This type of failure will be discussed in further detail hereinbelow. It is believed the shunt defects, both latent and patent, arise from one or more irregularities in the (1) morphology of the substrate material, or (2) in the growth of the semiconductor layers.

The first, and perhaps most important, source of the defects, i.e., the aforementioned morphological irregularities in the deposition surface of the substrate material will now be discussed. Even though the highest quality stainless steel is employed to serve as the substrate or base electrode upon which the semiconductor layers are successively deposited, it has been calculated that from 10,000 to 100,000 irregularities per square centimeter are present on the deposition surface thereof. Such irregularities take the form of projections, craters, or other deviations from a smooth finish and may be under a micron in (1) depth below the surface, (2) height above the surface, or (3) diameter. Regardless of their configuration or size, the defect may establish a low resistance current path through the semiconductor body, thereby effectively short-circuiting the two electrodes. This may occur in numerous ways. For instance, a spike projecting from the surface of the substrate electrode may be of too great a height to be covered by the subsequent deposition of semiconductor layers, and therefore, be in direct electrical contact with the other electrode when that electrode is deposited atop the semiconductor layers. Likewise, a crater formed in the surface of the substrate electrode may be of too small a size to be filled by the subsequent deposition of semiconductor layers and therefore, be in sufficient proximity to the other electrode, when that electrode is deposited atop the semiconductor layers, for electrical current to either (1) bridge the gap which exists between the electrodes, or (2) through actual use (the photoinduced generation of electrical current) of the photovoltaic device, cause the material of one of the electrodes to migrate toward and contact the other of the electrodes, and thereby pass electrical current therebetween. It is also possible that the semiconductor layers deposited onto the substrate are of poor quality, thereby providing a low resistance path for the flow of electrical current between the electrodes of the photovoltaic device.

Further, despite all the previously described efforts to maintain the vacuum envelope free of external contaminants; dust or other particulate matter, which somehow either (1) violates the sanctity of the vacuum envelope during the deposition of the semiconductor material, or (2) forms as a by-product of the deposition process is deposited atop the substrate electrode along with the semiconductor material. The contaminants interfere with the uniform deposition of the semiconductor layers and may establish the low resistance current path through which electrical current either (1) directly communicates, or (2) may, through operation of the device, develop communication with the two electrodes. Additionally, it is suspected that in some cases, the semiconductor material may form micro-craters or micro-projections during the deposition thereof, even absent the presence of contaminants or pollutants from external sources. Again, such morphological deviation from a perfectly smooth and even surface means that the substrate is covered by semiconductor material either (1) in an "ultra thin layer" (consider again that the total thickness of all semiconductor layers is only on the order of 4100 angstroms and any reduction in coverage is indeed an ultra thin layer) or (2) not at all. Obviously, when the upper electrode material is deposited across the entire surface of the semiconductor body, the defect regions cause the low resistance current path to develop, and electrical current is shunted therethrough. In still other cases involving defect regions, the presence of such defect regions are only detectable due to their deleterious effect upon the electrical and photoelectric properties of the resultant photovoltaic device. Finally, note the defects described hereinabove may not be sufficiently severe to divert all electrical current through the low resistance path. However, the diversion or shunting of any current therethrough represents a loss in operational efficiency of the photovoltaic device and should therefor be eliminated. Moreover, the shunting of even small amounts of current through each of thousands of defect regions may combine to cause major losses in efficiency. Based upon the foregoing, it should be apparent that a reduction in current flow through these defects and defect regions is critical to the fabrication of high-yield, high efficiency thin film photovoltaic devices.

Several approaches dealing with gross amplifications of this problem have been implemented by the Inventors and their colleagues. As described in U.S. Pat. No. 4,451,970 of Masatsugu Izu and Vincent Cannella, entitled System And Method For Eliminating Short Circuit Current Paths In Photovoltaic Devices, said application assigned to the assignee of the instant application, the shunting of current through defect regions is treated by substantially eliminating the defect regions as an operative area of the semiconductor device. This is accomplished in an electrolytic process where electrode material is removed from the periphery of the defect site, effectively isolating the defect region and preventing the flow of electrical current through the defect region. However, the process described in the '970 patent is current dependent, i.e., the greater the current flowing through a particular area of the device, such as a defect region, the greater the amount of electrode material (in the preferred embodiment indium tin oxide) is removed. Consequently, said short circuit eliminating process performs admirably in removing the electrode material from the periphery of a large defect, and thereby preventing all current flow therethrough. However, it is not as successful in eliminating the flow of current between the electrodes in the thousands of defect regions which are relatively small. And, as previously mentioned, since a great many of relatively small current shunting paths, taken in toto, divert a substantial amount of current from its desired path of travel through the semiconductor layers, the flow of current through the low resistance current paths created by such small defect regions must also be eliminated or at least substantially reduced. Further, the electrolytic process described in the '890 application neither detects nor helps in preventing the formation of current-shunting paths in the case of operational mode failures.

In U.S. Pat. No. 4,419,530 of Prem Nath, entitled Improved Solar Cell and Method For Producing Same, and assigned to the assignee of the instant invention, there is described a method for electrically isolating small area segments of an amorphous, thin film, large area photovoltaic device. This is accomplished by (1) dividing the large area device into a plurality of small area segments, (2) testing the small area segments for electrical operability, and (3) electrically connecting only those small area segments exhibiting a predetermined level of electrical operability, whereby a large area photovoltaic device comprising only electrically operative small area segments is formed. One cause of the electrical inoperability (failure of the device to meet predetermined minimum specifications) of small area segments is the presence of defect regions which operate to shunt current through low resistance paths. The method of solving the problem of defect regions in U.S. Pat. No. 4,419,530, while effective, eliminates rather large sections of the photovoltaic device. The output of the device is significantly reduced as compared to the output which could be realized if only the precise defect region was eliminated.

Further, both of the foregoing methods relate to "after market" techniques which are applicable to (1) isolate only gross defect-containing regions of a photovoltaic device, and (2) prevent any and all current flow through those defect-containing regions. Accordingly, a need still exists for a non-destructive method of substantially eliminating the deleterious effect of shunt defects, both large and small, whatever their origin, (1) prior to the completion of the photovoltaic device, i.e., prior to the deposition of the top electrode, (2) without operatively removing large portions of the active semiconductor body, and (3) while maintaining an acceptable level of current flow across the entire surface of the device.

Process related, short-circuiting defect problems arising in the fabrication of thin film photovoltaic devices were recognized as early as 1978 by scientists at R.C.A., who then attempted several methods for the cure of same. U.S. Pat. No. 4,162,505 of Joseph L. Hanak, assigned to R.C.A., entitled Inverted Amorphous Silicon Solar Cell Utilizing Cermet Layers, discloses the use of a thick film (2000 to 15000 angstroms) cermet layer to provide a ballast resistance which affords some protection from the effects of shorts and shunts in an inverted n-i-p, amorphous silicon solar cell. The thick cermet layer is disposed on the side of the amorphous silicon body opposite that side upon which light is incident. The location of the cermet layer (the side opposite incident light) in the R.C.A. cell is mandated by the thickness and consequent opacity thereof. If it were placed atop the incident side of the silicon body, the cermet layer would absorb most of the incident light, thereby rendering the cell inoperative. In the '505 patent, an additional thin (50–200 angstrom), high work function cermet layer is disposed atop the illuminated surface of the silicon body, the function of said thin layer being to provide ohmic contact between the electrode material and the p+ silicon layer. The patent neither discloses nor suggests that a short amelioration function may be attributable to the thin cermet layer.

Although U.S. Pat. No. 4,166,918 of Gerald E. Nostrand, et al, also assigned to R.C.A. and entitled: Method of Removing The Effects Of Electrical Shorts And Shunts Created During The Fabrication Process Of A Solar Cell, discloses a method of removing shunts by operatively disposing a thick cermet layer on the bottom surface of the cell, said thick cermet layer does not, in and of itself, cure the adverse effects of shorts and shunts. Nostrand, et al, must subsequently apply a reverse-bias voltage of sufficient magnitude to burn out the current-shunting defects in cermet containing solar cells. Only in this manner are Nostrand, et al able to improve their current and voltage output. The patent does not suggest the use of a cermet layer, which, taken alone, is capable of removing short circuit flow paths.

U.S. Pat. No. 4,167,015 of Joseph J. Hanak, assigned to R.C.A. and entitled: Cermet Layer For Amorphous Silicon Solar Cells is limited to the use of a thin (50–200 angstroms), high work function cermet layer either: (1) to form a Schottky barrier with amorphous silicon, or (2) as an aid to formation of an ohmic junction between the p+ amorphous silicon layer and the electrode in a p-i-n device. No disclosure of the use of a cermet layer for reducing the effects of existing, or preventing the generation of additional, shorts or shunts is provided. As succinctly stated in Column 4, lines 4–10 of the '015 patent: "Although the transparent high work function metal cermet would appear not to be needed in a PIN solar cell structure, the cermet adheres well to the p+ amorphous silicon layer, permits the formation of a good ohmic contact to the transparent conducting oxide layer 32 . . . ".

A general theoretical discussion of the use of a thin film series resistor to reduce or eliminate the effects of shorts in large area thin film photovoltaic devices was presented by Joseph J. Hanak in a paper entitled *Progress Toward Large Area Amorphous Silicon Solar Cells,* published in the proceedings of the "Fourteenth IEEE Photovoltaic Specialists Conference 1980," p. 623. Dr. Hanak concludes therein that a layer of cermet material, of appropriate resistance, can limit the harmful effects of shorts and shunts. However, his discussion of (1) barrier layer materials is carefully restricted to thick film cermets similar to those disclosed in the aforementioned R.C.A. assigned patents, and (2) the cermet layer, in order to act as a short preventing barrier, must be applied in a thickness of 5000–10000 angstroms, a thickness range which would not provide a transparent layer. Also discussed in the Hanak paper is the reverse-bias short removal technique described hereinabove with reference to the '918 patent.

U.S. Pat. No. 4,251,286, of Allen M. Barnett, entitled Thin Film Photovoltaic Cells Having Blocking Layers, describes a blocking layer deposited in a photovoltaic cell which is adapted to avoid electrical path failures by preventing undesired electrical contact which might otherwise occur between (1) the transparent and opaque electrodes of the cell, or (2) one of the electrodes and the remote semiconductor layer. Barnett's cells are fabricated from cadmium sulfide or cadmium zinc sulfide with a heterojunction of copper sulfide. His preferred embodiment includes a blocking layer formed from zinc sulfide which is 1000 angstroms to 5 microns thick. It should be readily apparent, in view of the discussion which preceded this paragraph, that even a 1000 angstrom thick layer of zinc sulfide would not provide adequate transparency to permit the use of that material adjacent the transparent electrode without blocking the entrance into the semiconductor layers of a substantial percentage of incident light. In an alternate embodiment, Barnett proposes the application of discontinuous insulating materials either by oxidizing the entire exposed surface of the semiconductor material, or by depositing a very thin insulating layer atop the semiconductor material prior to deposition of the second electrode.

Although Barnett does disclose the broad concept of employing a blocking layer to prevent short circuit paths, his teachings are not applicable to the production of a high quality photovoltaic device for the following reasons. First, Barnett's blocking layer is not formed of a material which is compatable with amorphous silicon alloys. If Barnett's blocking layer materials were employed in combination with the semiconductor layers utilized in the instant Inventor's cells, high losses in operational efficiencies of the cells would result. Second, Barnett's blocking layer is only adapted for operative disposition at the back side of a photovoltaic cell, vis-a-vis, a back reflective cell which requires that light strike the reflective back layer without absorptive losses due to the blocking layer. If a 1000 angstrom thick layer of zinc sulfide were employed at the incident side of the cell, too much light would be absorbed by the zinc sulfide layer. And even if the blocking layer were applied at the rear side of the cell, too much light would be absorbed to permit the efficient use of a back reflector. Third, Barnett suggests the use, albeit, in very sketchy forms, of a copper oxide blocking layer. While no specific thickness is disclosed, giving said copper oxide layer a thickness of 1000 angstroms (the thinnest range described for any blocking layer), Barnett is unable to provide an upper blocking layer which does not substantially interfere with the passage of incident light.

The instant invention, as will be described in greater detail hereinbelow, provides an improved photovoltaic device which (1) includes a transparent, easily fabricated barrier layer; and (2) provides relief from the effects of current-shunting defects, both patent and latent. Neither the materials from which the transparent barrier layer is fabricated, nor the techniques for fabricating the barrier layer are present in the prior art.

The configurations of short circuit preventing cermet materials disclosed in the R.C.A. patents are counterproductive if used in combination with the photovoltaic devices of the instant invention. More particularly, R.C.A.'s disclosures, taken singly or collectively, require the cermet materials to be deposited in thicknesses of 2000 to 15,000 angstroms in order to adequately limit the flow of current through defect sites. However, the opacity of a layer of cermet material of such thickness is too great for use in the photovoltaic devices.

Specifically, if a cermet layer of at least 2000 angstrom thickness were disposed upon the top surface of the semiconductor body of a p-i-n solar cell, photons from incident light would be unable to reach the active semiconductor body of the solar cell, thereby rendering the cell ineffective for its intended photovoltaic purpose. Furthermore, the photovoltaic cells of the instant invention incorporate a reflective substrate layer which redirects unused light energy which has made a first pass through the semiconductor body back through that body to increase device efficiency. The presence of an opaque, light-absorbing barrier layer atop the reflective substrate would prevent reflection of unused light, thereby preventing efficient use of incoming energy. While a substantially opaque barrier layer might be suitable for use in photovoltaic cells made according to the R.C.A. design, such an opaque layer, which is not necessary to provide ohmic contact between the p+ layer and the substrate, would detrimentally affect the performance of the Inventors' devices. Accordingly, the instant invention provides a substantially transparent barrier layer suitable for use on either or both surfaces of the semiconductor body and which is formed of materials neither disclosed nor suggested in the aforementioned R.C.A. prior art.

In addition to their opacity, R.C.A. cermet materials present process limitations which are not encountered when utilizing the materials disclosed in the practice of the instant invention. Firstly, the 2000-15000 angstrom thickness of the cermet layers (required by R.C.A.) necessitates a lengthy deposition procedure, which is undesirable in a high volume mass production process. Second and more importantly, the deposition of the cermet material is accomplished by a sputtering process, which is inherently destructive and therefore likely to introduce new defects in the material onto which it is deposited. More particularly, sputtering is an energetic coating process in which particles having high kinetic energy bombard the layer to be coated. These energetic particles are likely to harm either the entire 4100 angstrom thick amorphous silicon body of the cell or at least the top layer thereof onto which they are deposited. Such damage can result in immediate failure of the device, or can lead to operational mode failure. Although, the damage caused by the sputtering process may be controlled to some degree by decreasing the sputter rate, the deposition process is simultaneously slowed, thereby increasing the time required to deposit a layer of a given thickness.

In contrast thereto, the instant barrier layer is preferably deposited onto the semiconductor body by thermal evaporation, so as to obviate the problems of damage which result from sputtering techniques. Thermal evaporation processes (1) are reliable, (2) are rapid, (3) are easy to control, (4) utilize relatively simple equipment compared to sputter-coating processes, (5) have high deposition rates, and (6) do not damage the semiconductor body. Furthermore, the layers of material utilized in the instant invention are of approximately an order of magnitude lower thickness as compared to those thicknesses of the cermet materials described in the R.C.A. patents, thereby providing for (1) a more rapid fabrication procedure, and (2) transparency of those layers. Lastly, the problem of operational mode failure is neither recognized nor addressed by the prior art, and, therefore the method of preventing those failures cannot be anticipated by said prior art.

According to the principles of the preferred embodiment of the instant invention, a transparent "barrier layer" having a resistivity greater than the resistivity of the transparent electrode is interposed between one of the electrodes and the semiconductor body of the photovoltaic device. This barrier layer functions as a resistor to limit the flow of electrical current shunted through the short circuit defect path(s) of the photovoltaic devices. By selecting a barrier layer of optimized (1) resistivity, (2) thickness, and (3) transparency, the low resistance current path(s) may be substantially eliminated, while the negative effects of the barrier layer (including losses in efficiency and photoelectrical properties) on the photovoltaic device will be minimized. The method of depositing a barrier layer to substantially eliminate both patent and latent defect regions described herein, is readily adaptable for inclusion as one of the processing steps in the fabrication of amorphous, large area, thin film photovoltaic devices. The barrier layer may be deposited by techniques such as evaporation, vacuum deposition, chemical vapor deposition, or other processes which are compatible with the deposition steps utilized to fabricate the semiconductor layers and the electrode layers of the photovoltaic device. Accordingly, the instant invention provides an economical method for the high yield manufacture of improved amorphous, thin film, large area photovoltaic devices which are substantially free of low resistance current paths through which electrical current is likely to be shunted between electrodes, regardless of whether said low resistance paths are either initially or latently manifested.

These and other advantages of the instant invention will become apparent from the drawings, the detailed description of the invention and the claims which follow.

BRIEF SUMMARY OF THE INVENTION

There is disclosed herein an improved semiconductor device comprising a first electrode, an active semiconductor body deposited atop the first electrode, and a second electrode atop the semiconductor body. The semiconductor body of the semiconductor device is adapted to provide for the flow of electrical current in response to light energy incident thereon. The semiconductor device includes at least one defect region which provides a low resistance shunt path for the flow of electrical current between the electrodes thereof. The improvement in the semiconductor device comprises a continuous transparent barrier layer operatively disposed between the semiconductor body and one of the electrodes; the barrier layer functions to decrease the flow of electrical current through the at least one defect region of the semiconductor device. The barrier layer is formed from a material chosed from the group consisting essentially of oxides, nitrides and carbides of: indium, tin, cadmium, zinc, antimony, silicon, chromium and mixtures thereof. In the preferred embodiment, the second electrode is transparent and the barrier layer is operatively disposed between the semiconductor body and the transparent electrode of the semiconductor device. More particularly, the barrier layer is formed of tin oxide and is adapted for operative interposition between the transparent, indium tin oxide electrode and the semiconductor body. Alternatively, a tin oxide barrier layer may be interposed between the semiconductor body and the substrate electrode. Likewise, an oxidized or nitrided barrier layer may be operatively disposed between the substrate electrode and the semiconductor body of the semiconductor device. This layer may be formed by deposition techniques such as those used for depositing a barrier layer between the semiconductor body and the transparent electrode, or it may be formed by appropriate treatment of the material of the substrate electrode. For example, treatment of stainless steel with appropriate reagents will form an oxide or nitride layer. In a similar manner, substrates of aluminum, chromium, copper and the like may have barrier layers provided thereupon. Other embodiments may include a barrier layer formed of a non-amorphous Si based material.

There is also disclosed herein a method of making an improved semiconductor device of the type comprising a first electrode, an active semiconductor body disposed atop the first electrode and a second electrode disposed atop of the semiconductor body. The semiconductor body of the semiconductor device provides for the flow of electrical current in response to light incident thereon. The semiconductor device also includes at least one defect region which is capable of providing a shunt path for the flow of current between the electrodes thereof. The method includes the steps of (1) selecting a material from the group consisting of oxides, nitrides, and carbides of: indium, tin, cadmium, zinc, antimony, silicon, chromium and mixtures thereof; and (2) operatively disposing a continuous transparent barrier layer formed of the selected material between the semiconductor body and one of the electrodes, whereby the barrier layer functions to decrease the flow of elecrtrical current through said defect regions of said semiconductor device.

Finally, this application includes a method of substantially preventing operational mode failures of a semiconductor device which comprises a first electrode, a semiconductor body atop the first electrode, said semiconductor body adapted to provide for the flow of electrical current in response to light incident thereon, and a second electrode atop the semiconductor body. The semiconductor device includes at least one defect region capable of providing a shunt path for the flow of electrical current between the electrodes. The method includes the steps of: (1) selecting a material from the group consisting essentially of oxides, nitrides and carbides of: indium, tin, cadmium, zinc, antimony, silicon, chromium and mixtures thereof; and (2) depositing a continuous transparent barrier layer formed of the selected material between the semiconductor body and one of the electrodes, whereby the barrier layer functions to decrease the flow of electrical current through the at least one latent defect region to prevent operational mode failure of the semiconductor device.

BRIEF DESCRIPTION OF THE DRAWINGS

FIG. 2B is an exploded, perspective view of an improved semiconductor device depicting a first possible disposition of the barrier layer in solid lines, and a second possible disposition of the barrier layer in phantom lines;

FIG. 3A is a cross-sectional view of a prior art semiconductor device which has several defect regions formed therein; and FIG. 3B is a cross-sectional view of a semiconductor device showing the barrier layer of the instant invention, said barrier layer operatively disposed atop the semiconductor body so as to substantially eliminate the shunting of current through the low resistance defect regions of FIG. 3A.

DETAILED DESCRIPTION OF THE DRAWINGS

I. THE IMPROVED DEVICE

Figure 1:
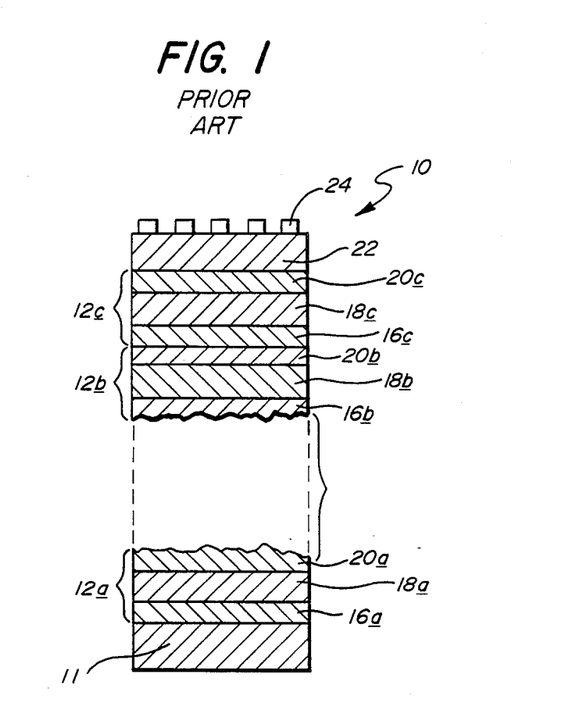
FIG. 1 is a fragmentary, cross-sectional view of a "non-barriered" tandem photovoltaic device, said device comprising a plurality of p-i-n type cells, each layer of the cells formed from a semiconductor alloy.

Referring now to the drawings and particularly to FIG. 1, a photovoltaic cell formed of a plurality of successive p-i-n layers each of which include a semiconductor alloy is shown generally by the numeral 10. While the cell 10 illustrated in FIG. 1 does not embody the barrier layer of the instant invention, it is typical of the type of photovoltaic cell in which the barrier layer is incorporated, and accordingly, a detailed description the cell 10 is necessary in order to understand the function of said barrier layer.

More particularly, FIG. 1 shows a p-i-n type photovoltaic device such as a solar cell made up of individual p-i-n type cells 12a, 12b and 12c. Below the lowermost cell 12a is a substrate 11, which (1) functions as the bottom electrode, and (2) may be transparent or formed from a metallic material such as stainless steel, aluminum, tantalum, malybdenum or chromium, or an insulating material such as glass with or without metallic particles embedded therein. Although certain applications may require a thin oxide layer and/or a series of base contacts prior to deposition of the semiconductor material, for purposes of this application, the term, "substrate" shall include not only a flexible film, but also any elements added thereto by preliminary processing.

Each of the cells, 12a, 12b and 12c are fabricated with an amorphous semiconductor body containing at least a silicon or germanium allow. Each of the semiconductor bodies includes a n-type conductivity semiconductor layer 20a, 20b and 20c; an intrinsic semiconductor layer 18a, 18b and 18c; and a p-type conductivity semiconductor layer 16a, 16b and 16c. As illustrated, cell 12b is an intermediate cell and, as indicated in FIG. 1, additional intermediate cells may be stacked atop the illustrated cells without departing from the spirit or scope of the present invention.

It is to be understood that following the deposition of the semiconductor layers, a further deposition process may be either performed in a separate environment or as a part of a continuous process. In this step, a TCO (transparent conductive oxide) layer 22, formed in the preferred embodiment of the indium tin oxide, also referred to herein as the top or upper electrode, is deposited atop the semiconductor material. An electrode grid 24 may be applied to the device where the cell is of a sufficiently large area, or if the conductivity of the TCO layer 22 is insufficient. The grid 24 shortens the carrier path through the TCO and thus increases the collection efficiency.

While the cell illustrated in FIG. 1 is a stacked assembly of p-i-n cells, the instant invention also embodies other cell arrangements such as single p-i-n cells, stacked or single n-i-p cells, p-n cells, Schottky barrier cells, and the like. Accordingly, in the description and claims which follow, the layer or layers of semiconductor material disposed between the substrate 11 and the upper electrode 22 will be generally referred to as the "semiconductor body", said term intended to include combinations of semiconductor layers of various conductivities and materials which will provide for a flow of electrical current when appropriately combined with one or more electrodes. This flow of electrical current is specifically defined to include the switching of current accomplished by photodiodes and phototransistors, as well as the generation of and collection of current accomplished by photovoltaic devices such as solar cells. Regardless of its ultimate configuration, it is for the purpose of substantially reducing the rate of flow of current through low resistance current paths between the substrate electrode and the top electrode that the instant invention was developed.

Figure 2A:
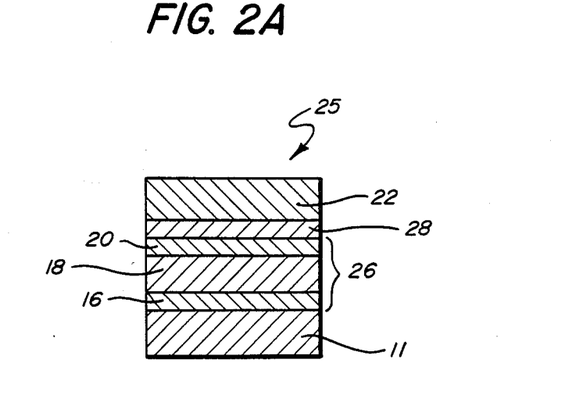
FIG. 2A is a cross-sectional view illustrating a first preferred embodiment of a semiconductor device incorporating the barrier layer of the instant invention.

Referring now to FIG. 2A, a photovoltaic device formed according to the principles of the instant invention is shown generally by the reference numeral 25. The photovoltaic device 25 includes a substrate 11, identical to the substrate described relative to the prior art cell 10 illustrated in FIG. 1, the substrate 11 forming the bottom or substrate electrode of the photovoltaic device. Disposed atop the substrate electrode 11, is the active semiconductor body 26, which body may include either a single layer or multiple layers of semiconductor matieral, the exact composition and configuration of said semiconductor layer(s) being irrelevant for the purpose of describing the function of the instant invention. FIG. 2A shows semiconductor body 26 as composed of P-type layer 16, an intrinsic layer 18, and an N-type layer 20. Atop the semiconductor body is deposited, or otherwise added, an upper or top electrode 22. As previously described, in the preferred embodiment, the upper electrode 22 is formed of indium tin oxide so as to be (1) transparent for the passage of light therethrough to the semiconductor body 26, (2) electrically conductive for the collection of current generated in the semiconductor body 26, and (3) of low resistivity to minimize losses in said collection of current. In another preferred embodiment, the top electrode 22 may be formed of an opaque, electrically conductive material, while the bottom electrode 11 may be formed of glass or similar transparent material having a conductive layer deposited or otherwise added thereto. Again, in the preferred embodiment, a barrier layer, generally referred to as 28, is operatively disposed between the top electrode 22 and the active semiconductor body 26. It is this relatively thin barrier layer 28 which functions to substantially decrease the short circuit flow of electrical current through the low resistance current paths developed between the top electrode 22 and the substrate electrode 11 due to the presence of current-shunting defect regions. It is to be noted that in the drawings, the reference numeral 28a will refer to a barrier layer operatively disposed between the semiconductor body 26 and the transparent electrode 22, while the reference numeral 28b will refer to a barrier layer operatively disposed between the semiconductor body 26 and the substrate electrode 11.

FIG. 2B is an exploded perspective view illustrating the operative disposition of the various layers which combine to form the photovoltaic device 25 embodying the barrier layer 28 of the instant invention. In this illustration, the active semiconductor body 26 is again operatively disposed atop and extends substantially coextensively with the substrate electrode 11. In a first embodiment, a barrier layer 28a is operatively disposed upon and substantially covers the entire surface of the semiconductor body 26, the upper electrode 22 being deposited atop said barrier layer 28. In an alternate preferred embodiment, a barrier layer 28b, shown in FIG. 2B in the phantom lines, may be located between the substrate electrode 11 and the semiconductor body 26. Regardless of its disposition in the photovoltaic device, the barrier layer 28 is capable of substantially decreasing the flow of current through low resistance current paths caused by defect regions. However, in some cases, it may be more advantageous to employ one disposition of the barrier layer than the other. For example, it may be more convenient to deposit the barrier layer 28 immediately prior to the deposition of, and in the same apparatus used for depositing, the upper electrode 22. In other cases, it may be preferable to deposit the barrier layer 28 directly atop the substrate electrode 11, thereby passivating the substrate 11 and preventing, or reducing the liklihood of, defect formation in subsequent semiconductor deposition processing. In still other cases, it may be advantageous to operatively dispose a barrier layer 28 both above and below the semiconductor body 26, thereby preventing current-shunting paths due to morphological problems in the substrate 11 and growth problems in the semiconductor body 26. It should be noted that, while the instant invention has the greatest relevance in large area photovoltaic devices, even small area devices are not defect free. Consequently, the concepts embodied herein are also adapted for application to small area photovoltaic devices.

II. THE DEFECT AND DEFECT REGIONS

Regardless of the exact manner in which the current-shunting defects arise, the defects manifest themselves phenomenologically as short circuit regions wherein low resistance current paths are formed between the upper electrode 22 and the substrate electrode 11 of a photovoltaic device 25. These defects may also be latently manifested by sudden catastrophic failure under operating conditions of the photovoltaic device 25. The instant procedure for substantially reducing current flow through low resistance defect regions is successful in substantially eliminating the current shunting effects of both of said patent and latent defects.

The formation and effect of said defects will be better understood by reference to FIG. 3A which illustrates a barrierless photovoltaic device 25 formed of a substrate electrode 11, an active semiconductor body 26, and a top electrode 22. A first defect region is depicted by a raised protuberance of spike 30 associated with and extending from the deposition surface of the substrate electrode 11. This raised protuberance 30 may result from, inter alia, (1) metallurgical irregularities such as impurities, inclusions, columnar growth, etc. in the material from which the substrate electrode 11 is formed, (2) mechanical damage due to nicks, abrasions, etc. occuring during handline of the substrate electrode 11, or (3) particles of dust or other particulate matter contaminating the surface of the substrate electrode 11 during handling, processing, etc. thereof. The protuberance 30 is of sufficient height so as to be either incompletely or inadequately covered by the subsequently deposited, layers of semiconductor mateiral 26. In this manner, a defect region is formed in the immediate vicinity of the protuberance 30. Obviously, where such defect regions occur in a semiconductor or photovoltaic device, a low resistance current path between the top transparent electrode 22 and the bottom substrate electrode 11 is established since the thickness, if any, of the semiconductor body 26 separating the two electrodes is insufficient to prevent current from shunting therebetween.

A second illustrated defect region is formed in the immediate vicinity of the crater, generally 32, which can originate in either (1) the substrate 11, or (2) the semiconductor body 26 of the photovoltaic device 25. As herein defined, "craters" include depressions in (1) the deposition surface of the substrate electrode 11, or (2) regions of the semiconductor device 25 onto which insufficient semiconductor material is deposited, thereby causing the top electrode 22 and the substrate electrode 11 to either (1) electrically approach, or (2) come into direct electrical contact with one another. Causes of such craters 32, which may also be referred to as pin holes or pits, may include (1) metallurgical or chemical irregularities in the surface the substrate 11, (2) impurities and inclusions in the semiconductor body 26, or (3) nonuniform deposition of the semiconductor layers. Regardless of how the crater 32 originates, deposition of the upper electrode material (in the preferred embodiment, indium tin oxide) atop a portion of the semiconductor body 26 having a crater 32 formed therein, results in the electrode material at least partially being deposited thereinto. A low resistivity current path is thereby established between the substrate electrode 11 and the upper electrode 22 through which electrical current is diverted from its normal path of travel through the semiconductor body 26 of the photovoltaic device 25. In FIGS. 3A and 3B, a crater formed due to a defect in the substrate 11 is illustrated by the reference numeral 32b, while a crater formed due to nonuniform deposition of the semiconductor body 26 is illustrated by the reference numeral 32a.

A third type of defect (not shown) can arise in poor quality regions of the semiconductor body. These regions, which may be of improper morphology or composition, exhibit low electrical resistivity relative to the remainder of the semiconductor body, and can thus provide a low-resistance current path between electrodes of the device.

Defects which provoke short circuit current flow generally cause impaired performance of the photovoltaic devices with which they are associated. Under operating conditions, the electrical potential established between the top electrode 22 and the bottom substrate electrode 11 will be decreased if such low resistance short circuit paths are present for the flow of electrical current generated by the device. Furthermore, if the short circuit current paths are either (1) of sufficient magnitude, or (2) of sufficient number, they can shunt a sufficient amount of current to render the entire photovoltaic device inoperative.

Referring now to the previously mentioned "operational mode failures", said failures are manifested bu a sudden catastrophic inability of the photovoltaic device to function under normal operating conditions even though the device has actively generated current for some period of time. Inventors believe operational mode failures result from a current or voltage driven reaction which exacerbates or intensifies latent defects existing in the photovoltaic device. Extremely high current densities are readily attained across defect sites having low resistivities. For example, a one micron square defect having a potential of one volt imposed thereacross could reach a current density of 100 Amperes/cm$^2$ which would destroy the device. Further, it is possible that under the influence of the electrical field developed between the top electrode 22 and the bottom substrate electrode 11 when the photovoltaic device 25 is operatively employed to produce electrical energy from incident light energy, electrode material may migrate across a defect site such as a crater 32 or a protuberance 30. Since the defect site is incompletely filled or covered upon deposition of the semiconductor material, even very slight migration may be sufficient, over a period of time, to establish a low resistivity current path through that defect site, effectively short circuiting the device. Once such a low resistance current path is established, under low intensity illumination, large amounts of current can readily flow therethrough and damage the overall operation of the photovoltaic device. Another possible explanation for operational mode failure might involve Joule heating and the resultant degradation of the semiconductor material proximate a defect region as current flows through that defect region.

Regardless of their cause and/or nature, the instant invention is adapted to substantially prevent the free flow of electrical current through these defect regions. Additionally, the barrier layer 28 of the instant invention is adapted to physically prevent migration of the electrode materials adjacent said defect sites.

III. THE BARRIER LAYER

Referring now to FIG. 3B, the barrier layer 28a of one preferred embodiment of the instant invention is shown operatively disposed between the semiconductor body 26 and the upper electrode 22 of a semiconductor device 25, said device possessing defects such as the aforementioned protuberance 30 and craters 32a and 32b. It will be noted the barrier layer 28 effectively isolates (1) the substrate electrode protuberance 30, (2) the substrate crater 32b, and (3) the semiconductor body crater 32a from the top electrode 22. The barrier layer 28a is formed of a material having a resistivity such that it will operate as a series resistor with the low resistivity current path formed by the defect. This series resistance effectively limits the flow of current through the short circuit current path, thereby substantially preventing (1) excess current flow therethrough and (2) substantially preventing excess current driven reactions from initiating or at least contributing to operational mode failure of photovoltaic devices. It should be appreciated in viewing FIG. 3B that, while the crater 32a is shown filled with barrier layer material 28a and the crater 32b is shown with the barrier layer material 28a only bridging the crater, the barrier layer material 28a may randomly fill or bridge the craters, irrespective of whether the crater originates in the substrate or the semiconductor body.

Note that the barrier layer 28 is deposited across the entire surface of the semiconductor body 26 and, accordingly, has the negative effect of placing an additional resistive force in the flow path of current generated by the photovoltaic device 25. However, since the electrical power generated by the device is given by the relationship $P=I^2R$, I being the current generated by the device, and R being the resistivity of the material through which the current flows, in instances where the generated current is low (as with current generated under room light conditions), the losses resulting from the addition of a low resistance barrier layer 28 will be minimal. And with the judicious selection of the barrier layer material and the thickness thereof, losses may be minimized even under AM1 conditions (i.e. the noonday insolation at the equator under a cloudless sky) in which the amount of current generated by the device is relatively large.

A barrier layer 28a deposited onto a semiconductor body 26 having associated crater defects 32b, may bridge the crevice defined by that crater, see FIG. 3B, and thus substantially prevent the subsequently deposited top electrode material 22 from filling the crevice and contacting the bottom substrate electrode 11. Alternatively, the barrier layer material 28a may fill the crater 32a and thus impose relatively high resistance between the electrodes of the device. While the foregoing description has primarily dealt with a barrier layer such as 28a which is operatively disposed atop the semiconductor body 26, the invention is not so limited. The barrier layer material can also be deposited directly atop the substrate electrode 11 and function in substantially the same manner as described for the barrier layer deposited atop the semiconductor body. It is also possible to form a barrier layer, such as 28b, atop the substrate 11 by chemical treatment of the substrate material so as to develop a "native" coating. For example, a stainless steel substrate may be subjected to an oxidizing, nitriding, or carbiding procedure which would yield a continuous layer of resistive material. Finally, it might also be desirable, in the proper situation, to incorporate two barrier layers of either similar or different materials, one barrier layer disposed atop the substrate electrode 11 and the other disposed atop the semiconductor body 26. These various embodiments are incorporated into the inventive concepts herein without departing from the spirit or scope of the present invention.

It is postulated that the improved function of photovoltaic devices which include the barrier layer 28 of the instant invention results from the "masking" of defect sites to place a current limiting resistance in series with the low resistance path developed by the defect region. Accordingly, a material suitable for use as a barrier layer in the practice of the instant invention must (1) be depositable as a relatively uniform, substantially continuous layer, (2) be deposited by a process which does not harm the semiconductor body 26; (3) have an appropriate resistivity (greater than that of the electrodes), and (4) be reasonably transparent (i.e. have a band-gap of approximately 2 eV), so as to not interfere with the absorption of light by the underlying semiconductor body or the reflection of light by the underlying substrate.

The thickness of the barrier layer is preferably maintained between 200 and 1500 angstroms. Barrier layers of less than 200 angstroms thickness are difficult to deposit uniformly and will not cover surface irregularities (such as those associated with current-shunting defects). Barrier layers exceeding 1500 angstroms are not preferred because of the difficulties of depositing appropriate materials of that thickness.

Obtaining an appropriate resistance value for the barrier layer is essential to the practice of this invention. If the barrier layer has too high a resistance, the current flow therethrough will be limited, and the photovoltaic efficiency of cells incorporating that layer will suffer. If the resistance of the layer is too low, it will not perform its desired function of limiting current flow through the low resistance defect regions. To some degree, the selection of a resistance value will depend upon the application to which the photovoltaic device in which it is incorporated is applied. For example, a cell operating under low light conditions, such as room light, generates a relatively low amount of photocurrent per unit area, and therefore, can operate efficiently despite the presence of a large resistance barrier layer (such as a barrier layer having a resistivity of $10^8$ ohms/cm$^2$). A cell designed for operation under intense illumination, such as bright sunlight, produces a relatively high amount of photocurrent per unit area. If the same large resistance barrier layer were used with such high photocurrents, the $I^2R$ losses would be unacceptable. Therefore, under intense illumination, a photovoltaic device requires a low resistance barrier layer (typically one of about $10^4$ ohms/cm$^2$). Thickness of the barrier layer is also important, since the resistance of the layer to current flow depends upon the specific resistivity and the thickness of the material forming the layer. Specific resistivities for materials favored for the practice of this invention fall within the range of $10^3$ to $10^8$ ohm-cm. A barrier layer formed of a material exhibiting the preferred resistivity of $10^4$ohms/cm$^2$ would, for a defect of one square micron, offer a resistance of 100 megohms, thus limiting the current to several amperes/cm$^2$. Catastrophic failures are thereby prevented.

There are wide varieties of materials that meet the foregoing criteria. Oxides, nitrides, and carbides of inorganic materials generally (1) have resistivities that fall within the desired range, and (2) are readily deposited to form barrier layers. Particular utility is shown by the oxygen, nitrogen, and carbon compounds of tin, germanium, silicon, titanium, zirconium, indium, aluminum, and chromium. Tin oxide is an example of one of the foregoing compounds that is readily deposited atop the semiconductor body to form a durable barrier layer having acceptable transparency to visible light, and producable with acceptable resistivities ranging from $10^4$ to $10^8$ ohm-cm, depending upon stoichiometry, the inclusion of dopants, etc.

The barrier layer may be deposited by any method such as: plasma deposition, evaporation, chemical vapor deposition, electroplating, or the like, provided said method of deposition is compatible with the previously deposited components of the device being fabricated.

It is possible to deposit both the barrier layer and the transparent electrode in a one-step process. For example, the deposition of indium tin oxide from an indium tin oxide containing crucible at elevated temperatures yields an electrically conductive layer, while the room temperature deposition results in an electrically resistive tin-oxide layer being deposited from the same crucible of starting materials. Thus, by initially performing the deposition at room temperature, and subsequently performing the deposition at higher temperature, a dual layer structure consisting of a barrier layer having a transparent conductive electrode layer thereupon is formed. Similarly, by gradually increasing the temperature, a graded structure having an insulating region and a conductive region is formed.

Tests were conducted to determine the effect of a barrier layer in preventing the flow of current through the low resistance defect regions of photovoltaic devices. The devices were tandem p-i-n cells formed of amorphous silicon layers deposited upon a stainless steel substrate electrode. The test devices were placed in a vacuum chamber, evacuated to a background pressure of less than $2 \times 10^{-5}$ torr, oxygen was introduced into the system to raise the pressure to $4 \times 10^{-4}$ torr, and a resistance heated procelain crucible located 18 inches from the devices was used to evaporate a coating of tin oxide onto the upper surface thereof. The evaporation rate was 4–5 angstroms/second and the evaporation proceeded until 1000 angstroms of tin oxide was deposited onto the semiconductor body. The array of devices was then removed from the deposition apparatus, and an electrode of indium tin oxide was deposited atop the tin oxide layer to complete fabrication of the photovoltaic devices. A second array, similar to the first, but having a 200 angstroms thich tin oxide layer was prepared in the same manner. These two test arrays of devices were then compared with a third array of photovoltaic devices which did not include the tin oxide barrier layer.

From the foregoing tests, it was ascertained that significant improvement occurs when the barrier layer is deposited onto the photovoltaic devices. The 200 angstrom layer did not function as well as the 1000 angstrom layer in preventing failures, although it did exhibit some improvement in short prevention. Applicants believe this is because the 200 angstrom layer is either (1) discontinuous, or (2) too thin to cover the defects. The conclusion is that, for this particular barrier layer material and cell type, a layer thicker than 200 angstroms must be employed to completely prevent shunting of current through the defect regions. Alternatively, a different barrier layer material, having a higher specific resistivity must be used if layer thickness is to be maintained at a level equal to or less than 200 angstroms level.

While the foregoing example and discussion centered upon photovoltaic devices, the invention could obviously be employed in conjunction with any semiconductor device wherein a layer of semiconductor material is interposed between two electrodes. For example, light emitting diodes, transistors, integrated circuits and the like would benefit from the elimination of internal short circuit type defects.

It is to be noted that modifications and variations of the instant invention are possible in light of the above techings. It is therefore the claims that follow, including all equivalents, that define the scope of the invention.

We claim:

1. In a semiconductor device comprising a first electrode; an active semiconductor body atop the first electrode, said semiconductor body including at least one triad of semiconductor layers, said triad comprised of two oppositely doped semiconductor layers having a layer of intrinsic semiconductor material disposed therebetween, said body adapted to provide for the flow of electrical current in response to the absorption of light energy incident thereon; a second electrode atop the semiconductor body; and at least one defect region which is capable of providing a low resistance shunt path for the flow of electrical current between the electrodes; the improvement comprising:

a continuous transparent barrier layer, formed of a material having an electrical resistivity greater than that of the electrodes, operatively disposed between the semiconductor body and one of the electrodes for decreasing the flow of electrical current through said at least one defect region of said semiconductor device.

2. A device as in claim 1, wherein the barrier layer is formed from a material chosen from the group consisting essentially of oxides, nitrides and carbides of: indium, tin, cadmium, zinc, antimony, silicon, chromium and mixtures thereof.

3. A device as in claim 1, wherein the second electrode is transparent.

4. A device as in claim 3, wherein the barrier layer is operatively disposed between the semiconductor body and the second transparent electrode.

5. A device as in claim 4, wherein the transparent second electrode is formed of indium tin oxide and the barrier layer is formed of tin oxide.

6. A device as in claim 5, wherein the indium tin oxide is graded so as to form an upper conductive region predominantly of indium tin oxide and a lower, resistive, semiconductor body-contacting region predominantly of tin-oxide.

7. A device as in claim 4, wherein the semiconductor body comprises amorphous p-i-n layers and the first electrode is formed of a, highly conductive metal.

8. A device as in claim 7, wherein said barrier layer has a thickness of greater than 200 angstroms.

9. A device as in claim 3, wherein the first electrode is formed of stainless steel, and the barrier layer is operatively interposed between the stainless steel electrode and the semiconductor body.

10. A device as in claim 9, wherein the barrier layer is a material formed as a product of oxidation of the stainless steel electrode.

11. A device as in claim 10, wherein the barrier layer is a material formed as a product of nitridation of the stainless steel electrode.

12. A device as in claim 1, wherein the barrier layer is formed from a transparent Si based alloy having a resistivity of $10^3 - 10^8$ ohms-cm.

13. A device as in claim 12, wherein the Si based alloy is non-amorphous.

14. In a photovoltaic device comprising a substrate electrode; an active semiconductor body atop the substrate electrode; a transparent, electrically conductive electrode atop the semiconductor body; and at least one defect region which is capable of providing a low resistance shunt path for the flow of electrical current between the electrodes; said semiconductor body including at least one triad of semiconductor layers, said triad comprised of two oppositely doped semiconductor layers having a layer of intrinsic semiconductor material disposed therebetween and adapted to generate electrical current in response to the absorption of light incident thereon; the improvement comprising:

a continuous transparent barrier layer, formed of a material having an electrical resistivity greater than that of the electrodes, operatively disposed between the semiconductor body and the transparent electrode for decreasing the flow of electrical current through said at least one defect region of said photovoltaic device.

15. A device as in claim 14, wherein said barrier layer is formed of a material chosen from the group consisting of oxides, nitrides and carbides of: indium, tin, cadmium, zinc, antimony, silicon and mixtures thereof.

16. A device as in claim 14, wherein the barrier layer is formed of tin oxide and the transparent electrode is formed of indium tin oxide.

17. A device as in claim 14, wherein the transparent electrode is graded so as to form an upper, conductive electrode predominately of indium tin oxide and a lower, resistive predominately of tin oxide.

18. A device as in claim 17, wherein the barrier layer is formed from a transparent Si based alloy having a resistivity of $10^3-10^8$ ohms-cm.

19. A device as in claim 18, wherein the Si based alloy is non-amorphous.

20. A device as in claim 14, wherein the barrier layer is greater than 200 angstroms thick.

* * * * *